(12) United States Patent
Chen et al.

(10) Patent No.: US 10,490,775 B2
(45) Date of Patent: Nov. 26, 2019

(54) PACKAGE STRUCTURE OF DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Shiqi Chen, Beijing (CN); Wei Guo, Beijing (CN); Yuanjie Xu, Beijing (CN); Zhonglin Cao, Beijing (CN); Pengcheng Zang, Beijing (CN); Ting Li, Beijing (CN); Jing He, Beijing (CN); Wenhua Song, Beijing (CN)

(73) Assignees: BOE TECHNOLOGY GROUP CO., LTD., Beijing (CN); CHENGDUE BOE OPTOELECTRONCS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 16/000,148

(22) Filed: Jun. 5, 2018

(65) Prior Publication Data
US 2019/0097174 A1   Mar. 28, 2019

(30) Foreign Application Priority Data
Sep. 27, 2017   (CN) .......................... 2017 1 0892435

(51) Int. Cl.
*H01L 51/52* (2006.01)
*B01D 53/04* (2006.01)
*B01D 53/26* (2006.01)

(52) U.S. Cl.
CPC .......... *H01L 51/5259* (2013.01); *B01D 53/04* (2013.01); *B01D 53/261* (2013.01);
(Continued)

(58) Field of Classification Search
None
See application file for complete search history.

(56) References Cited

U.S. PATENT DOCUMENTS

2006/0226762 A1   10/2006   Sasamoto et al.
2014/0087099 A1   3/2014    Veerasamy et al.
(Continued)

FOREIGN PATENT DOCUMENTS

CN   1845291 A     10/2006
CN   102870230 A   1/2013
(Continued)

OTHER PUBLICATIONS

The First Chinese Office Action dated Sep. 29, 2018; Appln. No. 201710892435.5.

*Primary Examiner* — Jack S Chen

(57) ABSTRACT

A package structure of a display panel and a display device are provided. The package structure of the display panel includes: a first substrate and a second substrate opposite to each other; and a display component, a drying layer, and a supporting layer, located between the first substrate and the second substrate; wherein, the supporting layer is configured to support the first substrate and the second substrate to maintain an interval between the first substrate and the second substrate, the drying layer and the supporting layer are directly connected with each other, the supporting layer includes a first sub-supporting layer, and the first sub-supporting layer is located on a side of the drying layer away from the display component.

16 Claims, 1 Drawing Sheet

(52) U.S. Cl.
CPC .... *H01L 51/5246* (2013.01); *B01D 2253/106* (2013.01); *B01D 2257/80* (2013.01)

(56) References Cited

U.S. PATENT DOCUMENTS

2014/0339510 A1   11/2014   Lee et al.
2017/0133624 A1    5/2017   Hong

FOREIGN PATENT DOCUMENTS

| CN | 104157667 A | 11/2014 |
| --- | --- | --- |
| CN | 104659073 A | 5/2015 |
| CN | 104838079 A | 8/2015 |
| CN | 105549272 A | 5/2016 |
| CN | 106571345 A | 4/2017 |
| CN | 106920892 A | 7/2017 |
| EP | 2564471 A2 | 3/2013 |
| KR | 100248999 B1 | 12/1999 |

PACKAGE STRUCTURE OF DISPLAY PANEL AND DISPLAY DEVICE

The present application claims priority of Chinese Patent Application No. 201710892435.5 filed on Sep. 27, 2017, the disclosure of which is incorporated herein by reference in its entirety as part of the present application.

TECHNICAL FIELD

Embodiments of the present disclosure relate to a package structure of a display panel and a display device.

BACKGROUND

Since a light-emitting layer of an organic light-emitting diode is very sensitive to both oxygen and moisture, requirements on package of an organic light-emitting diode device are relatively high.

SUMMARY

An embodiment of the present disclosure provides a package structure of a display panel, including: a first substrate and a second substrate opposite to each other, and a display component, a drying layer, and a supporting layer, located between the first substrate and the second substrate; wherein, the supporting layer is configured to support the first substrate and the second substrate to maintain an interval between the first substrate and the second substrate, the drying layer and the supporting layer are directly connected with each other, the supporting layer includes a first sub-supporting layer, and the first sub-supporting layer is located on a side of the drying layer away from the display component.

In an example, the supporting layer further includes at least one of a second sub-supporting layer or a third sub-supporting layer, in a direction perpendicular to the first substrate, the second sub-supporting layer is located between the first substrate and the drying layer, the third sub-supporting layer is located between the second substrate and the drying layer.

In an example, the drying layer is spaced apart from the first substrate and the second substrate.

In an example, a material of the drying layer is capable of changing color after absorbing water.

In an example, at least one of the first substrate or the second substrate is a glass substrate.

In an example, the supporting layer includes silicon dioxide.

In an example, the drying layer includes silica gel.

In an example, the first substrate has a flat surface, and in a direction parallel to the flat surface of the first substrate, the first sub-supporting layer protrudes from an edge of at least one of the first substrate or the second substrate.

In an example, the first substrate has a flat surface, and in a direction parallel to the flat surface of the first substrate, a side of the first sub-supporting layer is flushed with an edge of at least one of the first substrate or the second substrate.

In an example, the first substrate has a flat surface, and in the direction parallel to the flat surface of the first substrate, a sum of widths of the drying layer and the supporting layer is in a range of 1 mm to 2 mm.

In an example, the drying layer and the supporting layer are directly connected by a chemical bond.

In an example, the package structure further includes a sealant located between the display component and the drying layer.

In an example, an interval between the drying layer and the sealant is greater than or equal to 200 microns.

In an example, the first substrate has a flat surface, and in the direction parallel to the flat surface of the first substrate, the sum of widths of the drying layer and the supporting layer is 5 to 10 times of an interval between the drying layer and the sealant.

In an example, the display component is a display component having an organic light-emitting diode.

Another embodiment of the present disclosure provides a display device including any of the above described package structure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
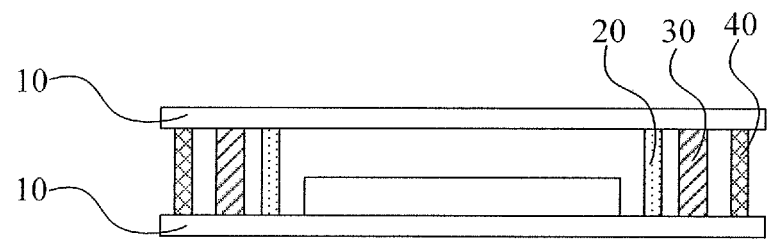
FIG. 1 is a schematic diagram of a package structure of a display panel.

A package structure of an organic light-emitting diode, as shown in FIG. 1, includes: two glass substrates 10, an organic light-emitting diode device, a desiccants 20, a sealant 30 and sintered glass 40 formed by sintering water soluble sodium silicate. The desiccants 20, the sealant 30 and sintered glass 40 are provided in a periphery of the organic light-emitting diode device in sequence. The sintered glass 40 and the two glass substrates 10 can be made of a same material, and are connected together by high-temperature sintering, thus capable of isolating external oxygen and moisture from the organic light-emitting diode device. The sealant further strengthens a mechanical strength of the package. However, when packaging and obstruction of oxygen and moisture is implemented by a three-layer structure of the desiccant, the sealant and the sintered glass, the structure is complicated, and the processing steps are numerous, resulting in a low production efficiency of the package structure of the organic light-emitting diode.

Figure 2:
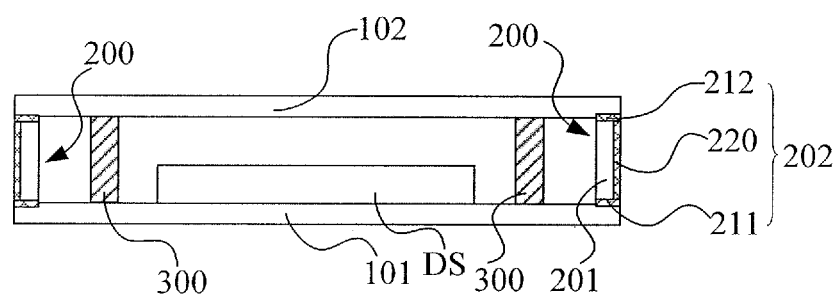
FIG. 2 is a schematic diagram of a package structure of a display panel according to an embodiment of the present disclosure.
Figure 3:
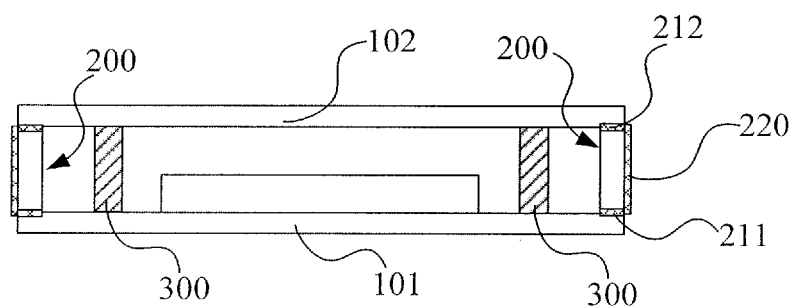
FIG. 3 is a schematic diagram of a package structure of a display panel of another embodiment of the present disclosure.

The package structure according to the embodiment of the present disclosure, as shown in FIG. 2 and FIG. 3, includes:

two substrates 101 and 102 opposite to each other; a display component DS located between the two substrates; and a sealing frame 200 formed in a periphery of the display component. The sealing frame 200 includes a drying layer 201 having a drying function and a hard supporting layer 202. The drying layer 201 is, for example, made of a material capable of being sintered with the substrate. The hard supporting layer 202 is configured to support the first substrate 101 and the second substrate 102 to maintain the space between the first substrate 101 and the second substrate 102. The hard supporting layer 202 includes, for example, a first sub-supporting layer 220, a second sub-supporting layer 211, and a third sub-supporting layer 212. At the connection between the sealing frame 200 and the substrate 101 is a first connection sintered layer 211 (an example of the second sub-supporting layer), and at the connection between the sealing frame 200 and the substrate 102 is a second connection sintered layer 212 (an example of the third sub-supporting layer). The side of the sealing frame 200 facing outside (i.e., the side facing away from the display component DS) is the outside sintered layer 220 (an example of the first sub-supporting layer). Herein, the outside sintered layer 220, the first connection sintered layer 211, and the second connection sintered layer 212 are of dense structure formed by sintering for obstructing oxygen and water.

It can be understood that although the hard supporting layer 202 includes all the first sub supporting layer 220, the second sub supporting layer 211, and the third sub supporting layer 212 in the above embodiment, embodiments of the present disclosure are not limited herein. In another example, the hard supporting layer 202 may only include the first sub supporting layer 220, while not include the second sub supporting layer 211 and the third sub supporting layer 212; in yet another example, the hard supporting layer 202 may only include the first sub-supporting layer 220 and the second sub-supporting layer 211, while not include the third sub-supporting layer 212; in yet another example, the hard supporting layer 202 may only include the first sub-supporting layer 220 and the third sub-supporting layer 212, while not include the second sub-supporting layer 211.

The package structure according to this embodiment includes the two substrates provided opposite to each other, the display component located between the two substrates; and the sealing frame formed in the periphery of the display component; the sealing frame is made of a material having a drying function that can be sintered with the substrate; the portions of the sealing frame connected the two substrates are sintered to form connection sintered layers which are dense structures for obstructing oxygen and water, and the side of the sealing frame facing outside is sintered to form the outside sintered layer, which is a dense structure for obstructing oxygen and water. With respect to the sealing frame in the package structure according to the embodiment, the connection sintered layers are provided at the connection between the sealing frame and the two substrates, and the side of the sealing frame facing outside is the outside sintered layer, the connection sintered layers and the outside sintered layer are of a dense structure formed by sintering for obstructing oxygen and water. Therefore, the connection sintered layers and the outside sintered layer together effectively prevent external oxygen and water from entering the space encapsulated by the sealing frame; meanwhile, a structure of the sealing frame except the connection sintered layers and the outside sintered layer still maintains its own drying function and is capable of absorbing moisture in the space sealed by the sealing frame. That is, the sealing frame, by itself, is capable of implementing dual functions of drying and sealing, and the package structure is simple and fewer processing steps are needed, which is convenient for production and fabrication, thus improving production efficiency of the package structure.

In a process of fabricating the package structure, it is necessary to judge whether or not the package structure is invaded by moisture. In order to facilitate judging whether or not the package structure is invaded by moisture, the material for forming the sealing frame in the package structure can also have a function of changing color after absorbing water.

In this way, except the connection sintered layers and the outside sintered layer, the structure of the sealing frame itself has the function of changing color after absorbing water, which changes color after absorbing moisture. By observation of whether or not the color of the structure of the sealing frame except the connection sintered layers and the outside sintered layer changes, it is possible to easily judge whether or not the package structure is invaded by moisture.

For example, the two substrates are glass substrates. In this case, the sealing frame can be a sealing frame made of silica gel. Silica gel itself is a highly active absorbent material that can absorb moisture and has a drying function. A main component of silica gel is silicon dioxide, which is consistent with the material of the glass substrate, which can be sintered together, the connection sintered layer and the outside sintered layer formed by high temperature sintering may well isolate external oxygen and moisture; the structure of the sealing frame except the connection sintered layers and the outside sintered layer maintains an original characteristic of silica gel and is capable of absorbing moisture in the space encapsulated by the scaling frame.

The sealing frame may also be a sealing frame formed of color changeable silica gel. The color changeable silica gel has a function of changing color after absorbing water, that is, it will change its color after absorbing moisture. By observing whether or not the color of the structure of the sealing frame except the connection sintered layers and the outside sintered layer changes, it is possible to easily judge whether or not the package structure is invaded by moisture.

An packaging process of the package structure according to an embodiment of the present disclosure is as follows:

Firstly, a silica gel frame is coated on the first substrate 101, an outer edge of the silica gel frame is flushed with an outer edge of the first substrate 101, the connection sintered layer 211 is formed at the connection between the silica gel frame and the substrate by laser sintering, and the connection sintered layer 211 is a dense structure for obstructing oxygen and water.

Thereafter, a display device DS is provided on the first substrate 101;

Then, the second substrate 102 is provided opposite to the first substrate, and the outer edge of the second substrate 102 is flushed with the outer edge of the first substrate 101; and the connection sintered layer 212 is formed at the connection between the silica gel frame and the second substrate 102 by laser sintering. The connection sintered layer 212 is a dense structure for obstructing oxygen and water;

Finally, the side of the silica gel frame facing outside is subject to laser sintering to form the outside sintered layer 220, and the outside sintered layer 220 is a dense structure for obstructing oxygen and water, referring to FIG. 2.

Another packaging process of the package structure according to an embodiment of the present disclosure is as follows:

Firstly, a silica gel frame is coated on the first substrate 101, and the connection sintered layer 211 is formed at the connection between the silica gel frame and the substrate by laser sintering, and the connection sintered layer 211 is of a dense structure for obstructing oxygen and water.

Thereafter, a display device DS is provided on the first substrate 101;

Then, the second substrate 102 is provided opposite to the first substrate, and the connection sintered layer 212 is formed at the connection between the silica gel frame and the second substrate 102 by laser sintering. The connection sintered layer 212 is of a dense structure for obstructing oxygen and water;

At last, the two substrates are squeezed so that the silica gel frame protrudes from the outer edges of the two substrates 101 and 102, the silica gel protruding from the outer edges of the two substrates is subject to laser sintering to form the outside sintered layer 220 protruding from the outer edges of the two substrates, referring to FIG. 3. The outside sintered layer 220 is of a dense structure for obstructing oxygen and water.

Referring to FIG. 3, an orthographic projection of a side surface of the outer sintered layer 220 away from the display device DS on a plane of an upper surface of the first substrate 101 is located outside the first substrate 101. The orthogonal projection of the side surface of the outside sintered layer 220 away from the display device DS on a plane of an lower surface of the second substrate 102 is located outside the second substrate 102. For example, the upper surface of the first substrate 101 and the lower surface of the second substrate 102 are flat surfaces that are parallel to each other. In the direction parallel to the upper surface of the first substrate 101 and the lower surface of the second substrate 102, the outside sintered layer 220 protrudes from the outer edges of at least one of the first substrate 101 and the second substrate 102. A side surface of the outer sintered layer 220 facing the display device DS is, for example, flushed with the outer edges of the first substrate 101 and the second substrate 102.

In this way, the outside sintered layer can be the outside sintered layer 220 protruding from the outer edges of the two substrates 101 and 102 as shown in FIG. 3, or can be the outside sintered layer 220 whose outer side is flushed with the outer edges of the two substrates 101 and 102 as shown in FIG. 2. Both the outside sintered layers of the two structures are conducive to processing and fabrication.

For example, a width of the sealing frame is any value of 1 mm to 2 mm. The sealing frame with a suitable width facilitates sintering to form the outside sintered layer and ensures that the outside sintered layer has a certain width, and at a same time, ensures a mechanical strength of package of the sealing frame.

In order to further improve the mechanical strength of package of the package structure, as shown in FIG. 2 and FIG. 3, the package structure may further include a sealant 300 located between the display component and the sealing frame 200. The sealant improves the mechanical strength of package of the package structure.

An interval between the sealing frame and the sealant can be greater than or equal to 200 microns. The two maintain a certain interval, which reduces mutual influence in a fabrication process.

The display device may be a display device having the organic light-emitting diode.

The present disclosure further provides a display device, including any one of the above-described package structures.

It is evident that one person skilled in the art can make various changes or modifications to the embodiments of the present disclosure without departure from the spirit and scope of the present disclosure. Thus, if these changes and modifications to the present disclosure are within the scope of the claims of the present disclosure and equivalent technologies, the present disclosure also intends to include all such changes and modifications within its scope.

The invention claimed is:

1. A package structure of a display panel, comprising:
    a first substrate and a second substrate opposite to each other; and
    a display component, a drying layer, and a supporting layer, located between the first substrate and the second substrate;
    wherein, the supporting layer is configured to support the first substrate and the second substrate to maintain an interval between the first substrate and the second substrate, the drying layer and the supporting layer are directly connected with each other, the supporting layer includes a first sub-supporting layer, and the first sub-supporting layer is located on a side of the drying layer away from the display component,
    the drying layer is made of a material capable of being sintered with the first substrate and the second substrate,
    the first sub-supporting layer is an outside sintered layer sintered from a side of a sealing frame facing outside, the outside sintered layer is of a dense structure for obstructing oxygen and water.

2. The package structure of a display panel according to claim 1, wherein, the supporting layer further includes at least one of a second sub-supporting layer or a third sub-supporting layer,
    in a direction perpendicular to the first substrate, the second sub-supporting layer is located between the first substrate and the drying layer, the third sub-supporting layer is located between the second substrate and the drying layer,
    the second sub-supporting layer is a first connection sintered layer sintered from the sealing frame and the first substrate, the first connection sintered layer is of a dense structure for obstructing oxygen and water,
    the third sub-supporting layer is a second connection sintered layer sintered from the sealing frame and the second substrate, the second connection sintered layer is of a dense structure for obstructing oxygen and water.

3. The package structure of a display panel according to claim 2, wherein, the drying layer is spaced apart from the first substrate and the second substrate.

4. The package structure of a display panel according to claim 1, wherein, a material of the drying layer is capable of changing color after absorbing water.

5. The package structure of a display panel according to claim 1, wherein, at least one of the first substrate or the second substrate is a glass substrate.

6. The package structure of a display panel according to claim 1, wherein, the supporting layer includes silicon dioxide.

7. The package structure of a display panel according to claim 1, wherein, the drying layer includes silica gel.

8. The package structure of a display panel according to claim 1, wherein, the first substrate has a flat surface, and in a direction parallel to the flat surface of the first substrate, the first sub-supporting layer protrudes from an edge of at least one of the first substrate or the second substrate.

9. The package structure of a display panel according to claim 1, wherein, the first substrate has a flat surface, and in a direction parallel to the flat surface of the first substrate, a side of the first sub-supporting layer is flushed with an edge of at least one of the first substrate or the second substrate.

10. The package structure of a display panel according to claim 1, wherein, the first substrate has a flat surface, and in the direction parallel to the flat surface of the first substrate, a sum of widths of the drying layer and the supporting layer is in a range of 1 mm to 2 mm.

11. The package structure of a display panel according to claim 1, wherein, the drying layer and the supporting layer are directly connected by a chemical bond.

12. The package structure of a display panel according to claim 1, further comprising: a sealant located between the display component and the drying layer.

13. The package structure according to claim 12, wherein, an interval between the drying layer and the sealant is greater than or equal to 200 microns.

14. The package structure of a display panel according to claim 12, wherein, the first substrate has a flat surface, and in the direction parallel to the flat surface of the first substrate, the sum of widths of the drying layer and the supporting layer is 5 to 10 times of an interval between the drying layer and the sealant.

15. The package structure of a display panel according to claim 1, wherein, the display component is a display component having an organic light-emitting diode.

16. A display device, comprising the package structure according to claim 1.

* * * * *